US012601689B2

(12) United States Patent
Mai et al.

(10) Patent No.: US 12,601,689 B2
(45) Date of Patent: Apr. 14, 2026

(54) ELECTRONIC PACKAGE HAVING HUMIDITY INDICATOR

(71) Applicant: Advanced Semiconductor Engineering, Inc., Kaohsiung (TW)

(72) Inventors: Shu Ting Mai, Kaohsiung (TW); Tzu Hsing Chiang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 462 days.

(21) Appl. No.: 17/716,918

(22) Filed: Apr. 8, 2022

(65) Prior Publication Data

US 2023/0324308 A1 Oct. 12, 2023

(51) Int. Cl.

| | |
|---|---|
| *G01N 21/81* | (2006.01) |
| *H01L 23/31* | (2006.01) |
| *H01L 23/00* | (2006.01) |
| *H10F 39/00* | (2025.01) |
| *H10F 77/50* | (2025.01) |
| *H10H 20/853* | (2025.01) |
| *H10K 50/84* | (2023.01) |

(52) U.S. Cl.
CPC ......... *G01N 21/81* (2013.01); *H01L 23/3121* (2013.01); *H01L 24/48* (2013.01); *H01L 2224/48225* (2013.01); *H01L 2924/12041* (2013.01); *H01L 2924/12043* (2013.01); *H01L 2924/12044* (2013.01); *H10F 39/804* (2025.01); *H10F 77/50* (2025.01); *H10H 20/853* (2025.01); *H10K 50/84* (2023.02)

(58) Field of Classification Search
CPC .... G01N 21/81; H10K 50/84; H01L 31/0203; H01L 2924/181; H01L 23/24; H01L 27/14618; H01L 23/3121; H01L 2224/48225; H01L 33/54; H01L 2924/12041; H01L 31/0488; H01L 2924/12044; H01L 2924/12043; H10F 77/50; H10F 39/804

USPC ......... 257/433, 690, 23.124, 23.126, 31.117; 438/64, 127; 206/204, 459.1

See application file for complete search history.

(56) References Cited

U.S. PATENT DOCUMENTS 6,559,439 B1 * 5/2003 Tsuchida ................ G02B 7/026
250/239
6,686,588 B1 * 2/2004 Webster .................. H01L 24/97
250/239

(Continued)

FOREIGN PATENT DOCUMENTS

CN          1660679 A       8/2005
CN        101747519 A       6/2010

(Continued)

OTHER PUBLICATIONS

Van Air Systems, Brown, Gray or Off-White Activated Alumina Desiccant Beads, Does Your Regenerative Dryer Desiccant Look Like This?*

*Primary Examiner* — David Chen

(74) *Attorney, Agent, or Firm* — Foley & Lardner LLP

(57) ABSTRACT

An electronic device is disclosed. The electronic device includes a carrier, an optical component disposed on the carrier and a humidity indicator within the electronic package. A position of the humidity indicator within the electronic package is arranged such that at least a part of the humidity indicator is visible from a viewpoint outside of the electronic package.

16 Claims, 14 Drawing Sheets

(56)  References Cited

U.S. PATENT DOCUMENTS

| | | | | |
|---|---|---|---|---|
| 6,737,176 | B1 * | 5/2004 | Otsuki | H05B 33/04 |
| | | | | 428/68 |
| 2004/0189195 | A1 * | 9/2004 | Allemand | H10K 50/84 |
| | | | | 257/E23.137 |
| 2004/0256592 | A1 * | 12/2004 | Takahashi | H10K 50/846 |
| | | | | 257/E23.137 |
| 2005/0179378 | A1 * | 8/2005 | Oooka | H10K 59/872 |
| | | | | 313/506 |
| 2005/0189629 | A1 | 9/2005 | Ito et al. | |
| 2006/0067647 | A1 * | 3/2006 | Chui | G02B 26/0841 |
| | | | | 385/147 |
| 2006/0077146 | A1 * | 4/2006 | Palmateer | B81B 7/0038 |
| | | | | 345/85 |
| 2007/0131944 | A1 * | 6/2007 | Hu | H10K 59/874 |
| | | | | 257/81 |
| 2008/0100934 | A1 * | 5/2008 | Webster | G02B 7/023 |
| | | | | 359/830 |
| 2011/0080516 | A1 * | 4/2011 | Yi | H04N 23/57 |
| | | | | 348/308 |
| 2017/0160509 | A1 * | 6/2017 | Wang | G02B 7/003 |
| 2017/0351049 | A1 * | 12/2017 | Yong | G01J 1/0271 |
| 2019/0165030 | A1 * | 5/2019 | Wang | H01L 23/5389 |

FOREIGN PATENT DOCUMENTS

| | | | | |
|---|---|---|---|---|
| CN | 106338462 | A | | 1/2017 |
| CN | 111916542 | A | * | 11/2020 |
| CN | 215112136 | U | | 12/2021 |
| JP | 2000260562 | A | * | 9/2000 |

* cited by examiner

ELECTRONIC PACKAGE HAVING HUMIDITY INDICATOR

BACKGROUND

1. Field of the Disclosure

The present disclosure relates generally to an electronic package.

2. Description of the Related Art

An electronic package may include some electronic or semiconductor devices (such as chips or dies) encapsulated (such as by using an encapsulant, a cover, a housing, and so on) using suitable packaging techniques to reduce exposure to atmospheric conditions, such as to moisture or oxygen, which may deleteriously affect the semiconductor devices.

In order to detect or monitor the moisture/humidity level/ value in an electronic package, a common approach is to provide a humidity sensor in the electronic package. However, the humidity sensor consumes power, and the sensitivity such humidity sensor may be low. In addition, the humidity sensor may be arranged at a position within the electronic package that is inconvenient for retrieval and hidden from the view of a user. Therefore, often times, in order to obtain the detected results of a humidity sensor, other parts of the electronic package may be destroyed or broken in the process.

SUMMARY

In some arrangements, an electronic device includes a carrier, an optical component disposed on the carrier and a humidity indicator within the electronic package. A position of the humidity indicator within the electronic package is arranged such that at least a part of the humidity indicator is visible from a viewpoint outside of the electronic package.

In some arrangements, an electronic device includes a circuit pattern layer and a humidity indicator in the circuit pattern layer.

In some arrangements, an electronic device includes an electronic component, an encapsulant covering the electronic component and a humidity indicator embedded in the encapsulant.

BRIEF DESCRIPTION OF THE DRAWINGS

Aspects of some arrangements of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
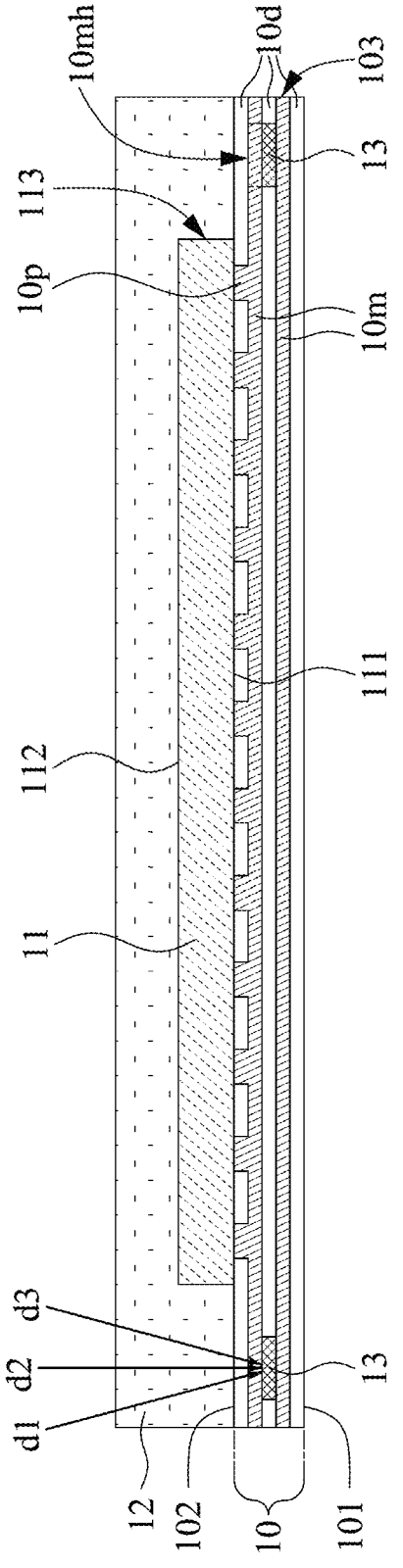
FIG. 1A illustrates a cross-sectional view of an example of an electronic package according to some arrangements of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Arrangements of the present disclosure relate to detecting and monitoring the moisture/humidity level/value of the electronic package in a non-destructive way. FIG. 1A illustrates a cross-sectional view of an example of an electronic package 1 according to some arrangements of the present disclosure. In some arrangements, the electronic package 1 may include a carrier 10, an electronic component 11, an encapsulant 12, and a humidity indicator 13.

Figure 3:
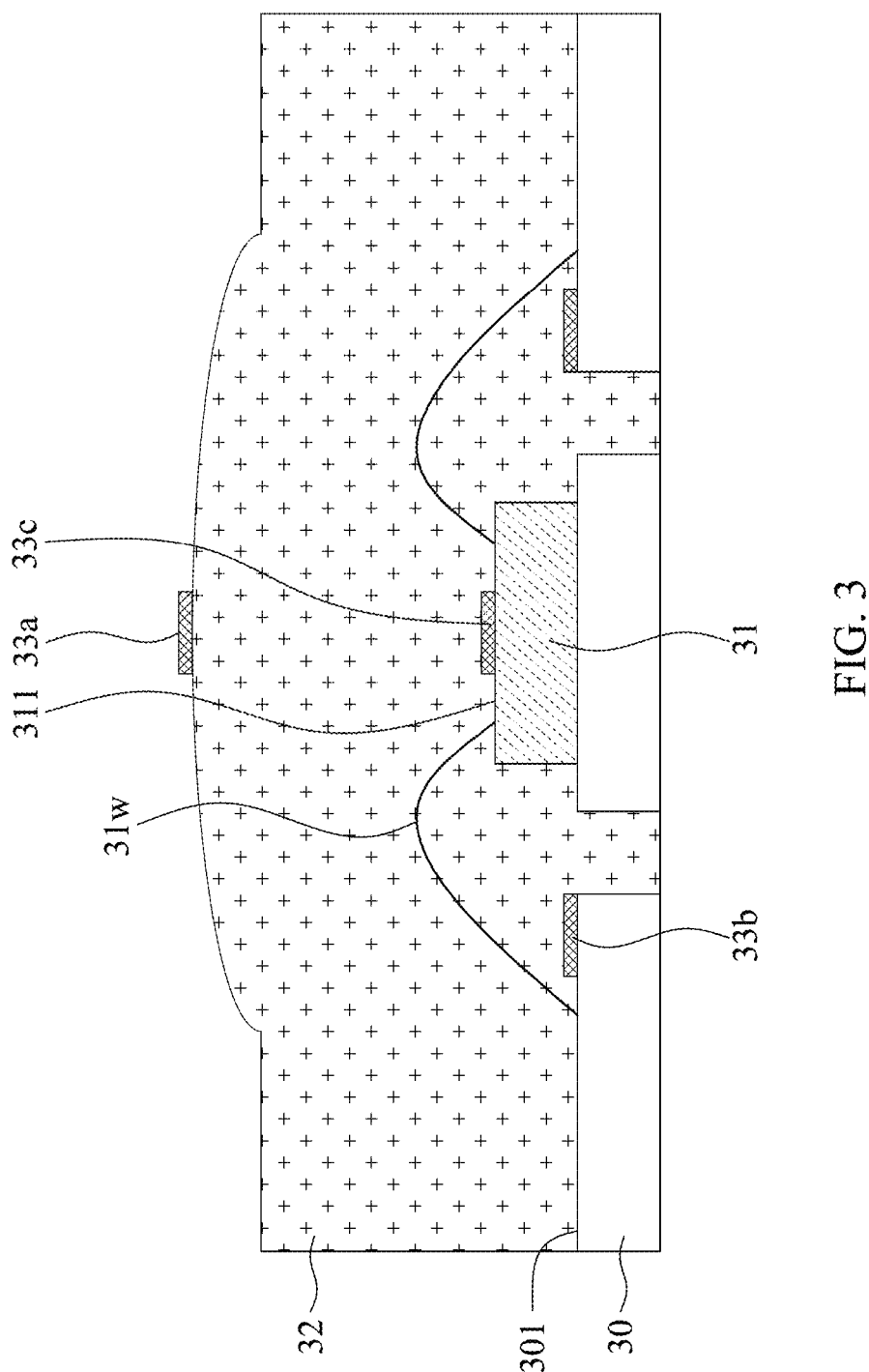
FIG. 3 illustrates a cross-sectional view of an example of an electronic package according to some arrangements of the present disclosure.

The carrier 10 may include a ceramic material, a glass material, a glass ceramic material, a metallic material, or so on. For example, the carrier 10 may include a silicon wafer, a silicon carbide (SiC) wafer, a glass wafer, a panel, a substrate, and so on. For example, the carrier 10 may include a lead frame, such as the carrier 30 as shown in FIG. 3. In some arrangements, the carrier 10 may include, for example, one or more of a printed circuit board (PCB), such as a paper-based copper foil laminate, a composite copper foil laminate, a polymer-impregnated glass-fiber-based copper foil laminate, and so on.

The carrier 10 may include an interconnection structure, such as a redistribution layer (RDL), a circuit pattern layer, a circuit layer, a conductive trace, a conductive via, etc. For example, the interconnection structure may include one or more metal layers 10*m* and one or more dielectric layers 10*d*. A portion of the metal layer 10*m* is covered or encapsulated by the dielectric layer 10*d* while another portion (e.g., on the lateral surfaces) of the metal layer 10*m* is exposed from the dielectric layer 10*d*.

The metal layer 10*m* may include, for example, aluminum (Al), copper (Cu), chromium (Cr), tin (Sn), gold (Au), silver (Ag), nickel (Ni) or stainless steel, another metal, or a mixture, an alloy, or another combination of two of more thereof.

The dielectric layer 10*d* may include molding compounds, pre-impregnated composite fibers (e.g., a pre-impregnated material "pre-preg"), borophosphosilicate glass (BPSG), silicon oxide, silicon nitride, silicon oxynitride, undoped silicate glass (USG), any combination of two or more thereof, or the like. Examples of molding compounds may include, but are not limited to, an epoxy resin including fillers dispersed therein. Examples of a pre-preg may include, but are not limited to, a multi-layer structure formed by stacking or laminating a number of pre-impregnated materials/sheets.

The carrier 10 may include a surface 101 and a surface 102 opposite to the surface 101. As shown, the surface 102 faces or is in direct contact with the encapsulant 12 and/or the electronic component 11. The surface 101 faces away from the encapsulate 12 and the electronic component 11. The carrier 10 may include one or more conductive pads 10*p* in proximity to, adjacent to, embedded in, and/or exposed from the surfaces 101 and/or 102 of the carrier 10. The carrier 10 may include a solder resist (not shown) on the surface 101 and/or 102 of the carrier 10 to fully expose or to expose at least a portion of the conductive pads 10*p* for electrical connections of the electronic package 1.

The electronic component 11 may be disposed on the surface 102 of the carrier 10. The electronic component 11 may be disposed on the carrier 10 by, for example, surface mounting techniques (SMT) or another suitable mechanism for mounting an electronic component on a carrier. The electronic component 11 may be connected to the carrier 10 by way of flip-chip or wire-bond techniques, for example.

The electronic component 11 may be a chip or a die including a semiconductor substrate, one or more integrated circuit (IC) devices, and one or more overlying interconnection structures therein. The integrated circuit devices may include active devices such as transistors and/or passive devices such resistors, capacitors, inductors, or a combination thereof.

In some arrangements, the electronic component 11 may be or include, for example, one or more of a processor, a controller, a memory, an input/output (I/O) buffer, or a sensor (e.g., a motion sensor, a pressure sensor, a temperature sensor, an optical sensor, a proximity sensor, a microelectromechanical systems (MEMS) sensor, or the like), and so on.

In some arrangements, the electronic component 11 may be or include, for example, one or more optical components, such as a charged coupled device (CCD), a complementary metal-oxide semiconductor (CMOS) image sensor, and a photodiode, a light-emitting diode (LED) and an organic light-emitting diode (OLED), or other devices used to detect or emit visible light and/or other forms of electromagnetic radiation.

The electronic component 11 may include a surface 111 and a surface 112 opposite to the surface 111. The surface 111 may be an active surface and the surface 112 may be a backside surface. The active surface (e.g., the surface 111) of the electronic component 11 may face or be in direct contact with the carrier 10. The backside surface (e.g., the surface 112) of the electronic component 11 may face away from the carrier 10 and be covered by the encapsulant 12. As used herein, the term "active side" or "active surface" of an electronic component may refer to a side or a surface of an electronic component on which electrical or contact terminals such as contact pads, conductive studs or conductive pillars are disposed, for transmission of electrical signals or power. The "inactive side" or "inactive surface" of an electronic component may refer to a surface of the electronic component on which no contact terminals are disposed.

The location and the number of the electronic components 11 in the electronic package 1 may be adjusted according to design requirements and are not limited to the specific examples shown in the figures.

The encapsulant 12 may be disposed on the surface 102 of the carrier 10 to cover or encapsulate the electronic component 11 and cover at least a portion or the entirety of the surface 102. In some arrangements, the encapsulant 12 may cover or encapsulate the surface 112 and one or more lateral surfaces of the electronic component 11 that connect the surfaces 111 and 112.

The encapsulant 12 may include, for example, an epoxy resin having fillers, a molding compound (e.g., an epoxy molding compound or another molding compound), a polyimide, a phenolic compound or material, a material with a silicone dispersed therein, or a combination thereof. In some arrangements, the encapsulant 12 may include a light transmissive material. The light transmissive material may be a clear epoxy or other light transmissive epoxy or other resin or polymer.

The humidity indicator 13 may be disposed within the electronic package 1. The humidity indicator 13 may be disposed on the carrier 10 in some examples. The humidity indicator 13 may be disposed in the carrier 10 in some examples. The humidity indicator 13 may be at least partially covered/enclosed by or embedded in the carrier 10. In some examples, the humidity indicator 13 is entirely covered by, enclosed by, or embedded in the carrier 10. The humidity indicator 13 may be disposed on or near a periphery portion of the carrier 10. The periphery of portion of the carrier 10 is a portion of the carrier 10 that is adjacent to or includes one or more lateral surfaces of the carrier 10 that connect the surfaces 101 and 102 of the carrier 10. The humidity indicator 13 may be disposed on or near a periphery of the electronic component 11. The periphery of portion of the electronic component 11 is a portion of the electronic component 11 that is adjacent to or includes one or more lateral surfaces of the electronic component 11 that connect the surfaces 111 and 112 of the electronic component 11. In some examples, the humidity indicator 13 (e.g., a center point thereof) may be disposed closer to an edge (e.g., a lateral surface 103) of the carrier 10 than a closest edge (e.g., a closest lateral surface 113) of the electronic component 11.

For example, the humidity indicator 13 may be disposed adjacent to an edge of the carrier 10.

In some arrangements, the humidity indicator 13 may be disposed on an interface or interface region between two layers or regions of different or dissimilar materials in the electronic package 1. For example, the humidity indicator 13 may be disposed on an interface through which atmospheric elements, such as moisture or oxygen, are able to infiltrate into the electronic package 1. For example, the humidity indicator 13 may be adjacent to an interface or interface region between two layers or regions of different or dissimilar materials in the electronic package 1. For example, the humidity indicator 13 may be disposed on or adjacent to a heterogeneous interface. For example, the humidity indicator 13 may be covered or embedded by at least two dissimilar materials. For example, the humidity indicator 13 may be in contact with at least two dissimilar materials.

Figure 1B:
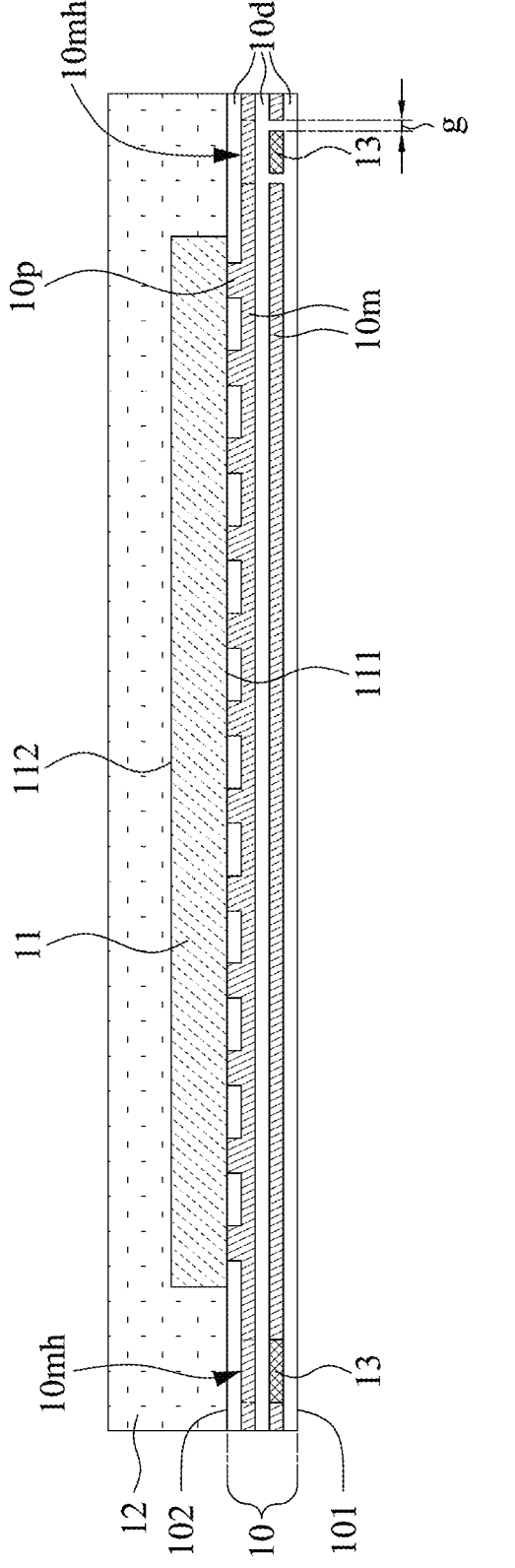
FIG. 1B illustrates a cross-sectional view of an example of an electronic package according to some arrangements of the present disclosure.
Figure 1C:
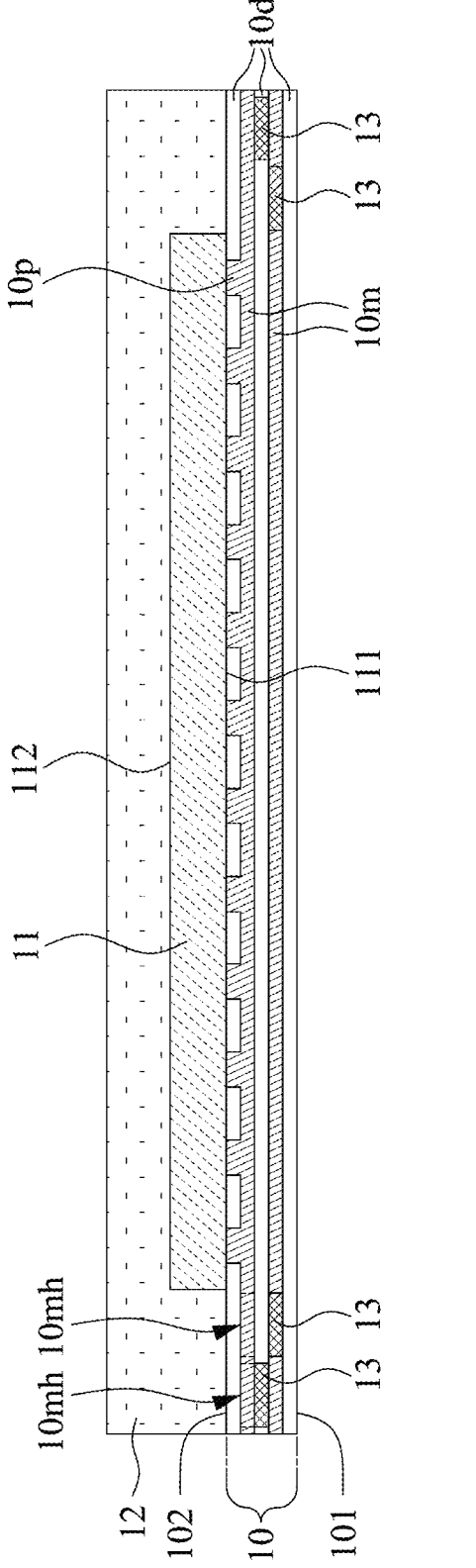
FIG. 1C illustrates a cross-sectional view of an example of an electronic package according to some arrangements of the present disclosure.

In some arrangements, the humidity indicator 13 may be disposed on an RDL of the electronic package 1. For example, the humidity indicator 13 may be in contact with the RDL. For example, the humidity indicator 13 may be disposed at the substantially same elevation as the dielectric layer 10d (as shown in FIG. 1A) relative to the surface 101, along a vertical axis perpendicular to or traversing the surface 101 or 102, at the substantially same elevation as the metal layer 10m (as shown in FIG. 1B) relative to the surface 101, along a vertical axis perpendicular to or traversing the surface 101 or 102, or at the substantially same elevation as both the dielectric layer 10d and the metal layer 10m relative to the surface 101 or 102, along a vertical axis perpendicular to or traversing the surface 101 or 102 (as shown in FIG. 1C).

For example, as shown in FIG. 1A, the humidity indicator 13 may be disposed on the same layer as the dielectric layer 10d. In some examples, a lower surface of the humidity indicator 13 facing the surface 101 is substantially coplanar with a lower surface of the dielectric layer 10d facing the surface 101. In some examples, an upper surface of the humidity indicator 13 facing the surface 102 is substantially coplanar with an upper surface of the dielectric layer 10d facing the surface 102. The humidity indicator 13 may be disposed in the dielectric layer 10d. The humidity indicator 13 may be a part of the dielectric layer 10d. The humidity indicator 13 may be embedded within the dielectric layer 10d. The humidity indicator 13 may be surrounded by the dielectric layer 10d. The humidity indicator 13 may be in contact with the dielectric layer 10d. In some examples, a lower surface of the humidity indicator 13 facing the surface 101 may have a substantially same elevation relative to the surface 101 as a lower surface of the dielectric layer 10d facing the surface 101, along a vertical axis perpendicular to or traversing the surface 101 or 102. In some examples, an upper surface of the humidity indicator 13 facing the surface 102 may have a substantially same elevation relative to the surface 101 as an upper surface of the dielectric layer 10d facing the surface 102, along a vertical axis perpendicular to or traversing the surface 101 or 102.

For example, as shown in FIG. 1A, the humidity indicator 13 may be misaligned with the metal layer 10m in a direction substantially perpendicular to or traverses the surface 101 and/or the surface 102 of the carrier 10 due to presence of an opening 10mh (e.g., hole or cavity). In some arrangements, the humidity indicator 13 and the metal layer 10m may be non-overlapping in a direction substantially perpendicular to or traverses the surface 101 and/or the surface 102 of the carrier 10 due to presence of an opening 10mh. For example, the metal layer 10m above the humidity indicator

13 may define the opening 10mh for exposing at least a part of the humidity indicator 13. For example, the metal layer 10m above the humidity indicator 13 may be disposed around the humidity indicator 13 and leave a cavity where the humidity indicator 13 is located to expose at least a part of the humidity indicator 13 through the cavity. For example, the metal layer 10m above the humidity indicator 13 may not cover the humidity indicator 13, such that no portion of the metal layer 10m is between the humidity indicator 13 and the surface 102.

The humidity indicator 13 may include a humidity-sensitive material. For example, the humidity indicator 13 may include cobalt chloride ($CoCl_2$), copper sulphate ($CuSO_4$), copolymers thereof, blends thereof, and so on. The humidity indicator 13 may be in a powder form, a test paper form, or a combination thereof.

For example, the humidity indicator 13 in a powder form may include particles blended, dispersed, or distributed in one or more layers in the carrier 10. The humidity indicator 13 in a powder form may exist in a partial region in (e.g., a portion of) a layer of the carrier 10. The humidity indicator 13 in a powder form may be disposed in an elevation or a layer in the carrier 10 that is predetermined to detect or monitor the moisture/humidity level/value therein. For example, as shown in FIG. 1A, the humidity indicator 13 may present in only a confined region of the dielectric layer 10d. However, in some other arrangements, the humidity indicator 13 may be substantially distributed in an entire layer of the dielectric layer 10d.

For example, the humidity indicator 13 in a test paper form may include a film, a strip, or other shapes. For example, the humidity indicator 13 in a test paper form may include a slip of paper, a piece of paper, or other test papers, such as a $CoCl_2$ test paper.

In some arrangements, the conditions (such as the exterior surface, the contour, the texture, the color, the crystalline state and so on) of the humidity indicator 13 may vary as a function of with respect to atmospheric elements (such as moisture, oxygen, or other chemical compounds or chemical elements) present inside the electronic package 1. For example, a chemical property of the humidity indicator 13 may vary as a function of the moisture/humidity level/value inside the electronic package 1. For example, a color of the humidity indicator 13 may vary as a function of the moisture/humidity level/value inside the electronic package 1. For example, a crystalline state of the humidity indicator 13 (e.g., copper sulphate ($CuSO_4$)) may vary as a function of the moisture/humidity level/value inside the electronic package 1.

The locations and numbers of the humidity sensors 13 in the electronic package 1 may be adjusted according to design requirements and are not limited to the specific examples shown in the figures.

According to some arrangements of the present disclosure, the encapsulant 12 and/or the dielectric layer 10d of the carrier 10 may be transparent or have a relatively high light transmission rate for wavelengths in the range of visible light, infrared light, ultraviolet light, and so on. For example, the encapsulant material can be seen through by a naked human eye or optical equipment. For example, at least a part of the humidity indicator 13 may not be hidden from view by the encapsulant 12 or the dielectric layer 10d of the carrier 10 when viewed by an operator in a direction (such as in the directions d1, d2 or d3) that traverses the top surface of the encapsulant 12 and the surfaces 101 and/or 102. Particularly, given that 1) the view path (e.g., in a direction that traverses the top surface of the encapsulant 12 and the surfaces 101 and/or 102) includes the encapsulant 12, the dielectric layer 10*d*, and the metal layer 10*m*, 2) the transparency of the encapsulant 12 and the dielectric layer 10*d*, and 3) the opening 10*mh* in the metal layer 10*m*, an operator or optical equipment can easily identify and observe the humidity indicator 13 in the view path.

For example, although the humidity indicator 13 is physically covered by the encapsulant 12, the metal layer 10*m*, and the dielectric layer 10*d* of the carrier 10, at least a part of the humidity indicator 13 is visible from a viewpoint outside of the electronic package 1 by a naked human eye or optical equipment. In other words, a position of the humidity indicator 13 within the electronic package 1 is arranged such that the humidity indicator 13 is visible from a viewpoint outside of the electronic package 1 by a naked human eye or optical equipment. Therefore, the conditions (such as the exterior surface, the contour, the texture, the color, and so on) of the humidity indicator 13 may be observed or detected by a naked human eye or optical equipment to determine the moisture/humidity level/value inside the electronic package 1 in a non-destructive way.

For example, the moisture/humidity level/value inside the electronic package 1 may be determined based on the conditions (such as the exterior surface, the contour, the texture, the color, and so on) or appearance of the visible part of the humidity indicator 13. For example, at least a part of the humidity indicator 13 may be visible without destroying or breaking the electronic package 1. Therefore, the moisture/humidity level/value in the electronic package 1 may be determined in a non-destructive way.

In addition, in comparison with a power-consuming humidity sensor, the humidity sensor 13 does not rely on electricity to operate and thus is cost-saving. Furthermore, the sensitivity of the humidity sensor 13 is usually higher and more stable than a power-consuming humidity sensor.

FIG. 1B illustrates a cross-sectional view of an example of an electronic package according to some arrangements of the present disclosure. The electronic package in FIG. 1B is similar to the electronic package 1 in FIG. 1A. Therefore, some detailed descriptions may refer to the corresponding paragraphs above and are not repeated hereinafter for conciseness.

As shown in FIG. 1B, the humidity indicator 13 may be disposed on the same layer as the metal layer 10*m*. In some examples, a lower surface of the humidity indicator 13 facing the surface 101 may is substantially coplanar with a lower surface of the metal layer 10*m* facing the surface 101. In some examples, an upper surface of the humidity indicator 13 facing the surface 102 is substantially coplanar with an upper surface of the metal layer 10*m* facing the surface 102.

The metal layer 10*m* may be electrically connected with the electronic component 11 while the humidity indicator 13 may be electrically insulated from the electronic component 11. For example, the humidity indicator 13 may be electrically disconnected from the electronic component 11.

In some arrangements, the humidity indicator 13 may be disposed on a dummy region of the metal layer 10*m*. For example, the humidity indicator 13 on the right side of FIG. 1B may be physically spaced apart from the metal layer 10*m* by a gap "g," which surrounds the humidity indicator 13. The gap g may be filled with the dielectric layer 10*d* of the carrier 10. For example, the metal layer 10*m* may define an opening for exposing at least a part of the humidity indicator 13. For example, the metal layer 10*m* may be disposed around the humidity indicator 13 to expose at least a part of the humidity indicator 13.

FIG. 1C illustrates a cross-sectional view of an example of an electronic package according to some arrangements of the present disclosure. The electronic package in FIG. 1C is a combination of the electronic packages in FIG. 1A and FIG. 1B. Therefore, some of its features are described in the corresponding paragraphs above, which are not repeated for conciseness.

By disposing the humidity indicator 13 adjacent to or in contact with the RDL, the moisture/humidity level/value around the RDL can be detected to observe the delamination of the layers of the RDL.

Figure 1D:
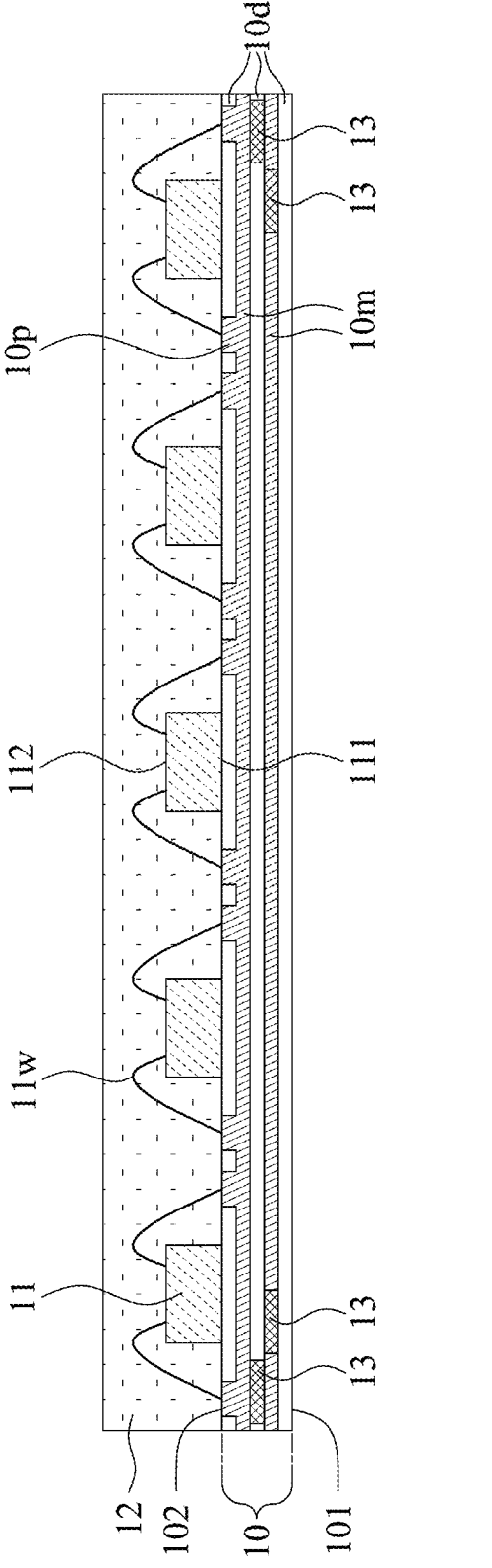
FIG. 1D illustrates a cross-sectional view of an example of an electronic package according to some arrangements of the present disclosure.

FIG. 1D illustrates a cross-sectional view of an example of an electronic package according to some arrangements of the present disclosure. The electronic package in FIG. 1D is similar to the electronic package 1 in FIG. 1A. Therefore, some of its features are described in the corresponding paragraphs above, which are not repeated hereinafter for conciseness.

As shown in FIG. 1D, the electronic component 11 may include one or more electromagnetic radiation-emitting devices, such as LEDs, OLEDs, or the like. In some arrangements, the electronic component 11 may include an LED array.

In some arrangements, the electronic component 11 may be electrically connected to the carrier 10 by a conductive wire 11*w*, one end of which is bonded to the wire-bonding pad of the electronic component 11 and another end of which is bonded to a wire-bonding pad of the carrier 10.

In some arrangements, the electronic component 11 may be configured to emit or radiate various wavelengths of visible light and/or other forms of electromagnetic radiation from the active surface (e.g., the surface 111). In some arrangements, the surface 111 may face away from the carrier 10.

The humidity indicator 13 of the present disclosure may be used in various applications such as optical sensing applications, optical communications, electronics and microelectromechanical systems (MEMS), storage devices, and so on. The humidity indicator 13 of the present disclosure may be used in various package designs, such as a 3D package, a 5D package, a fan-out package, a system-in-package (SiP), and so on.

Figure 2A:
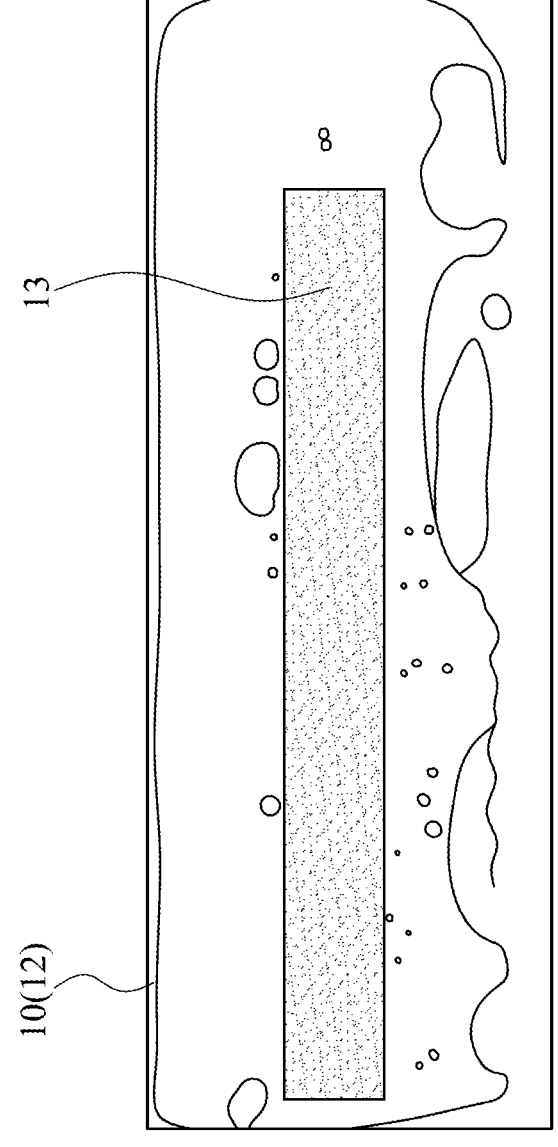
FIG. 2A illustrates a cross-sectional view of a part of an example of an electronic package according to some arrangements of the present disclosure.
Figure 2B:
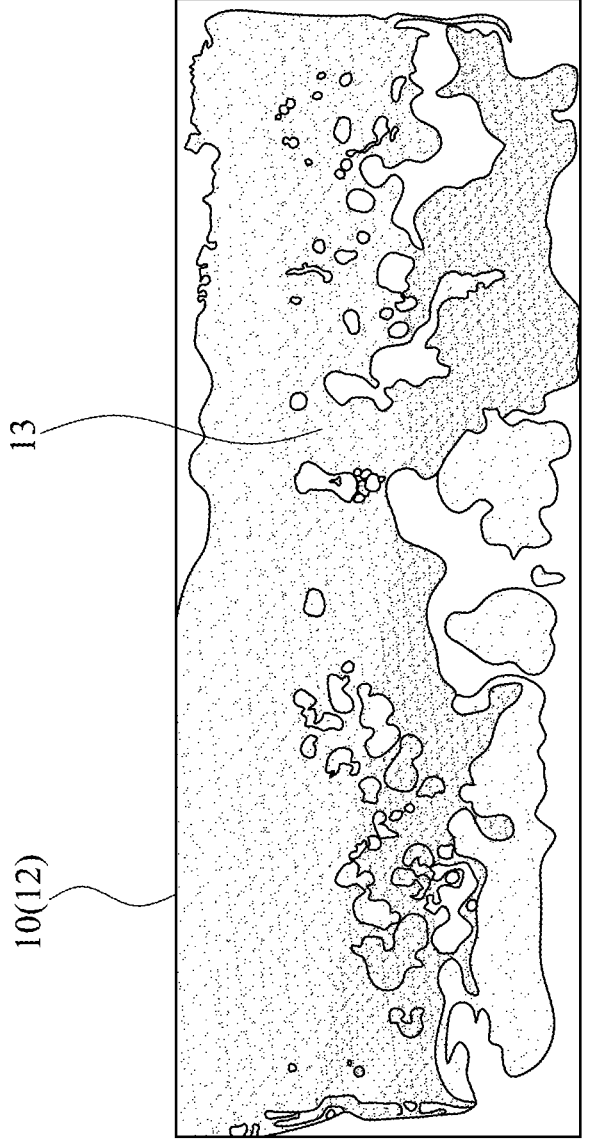
FIG. 2B illustrates a cross-sectional view of a part of an example of an electronic package according to some arrangements of the present disclosure.
Figure 2C:
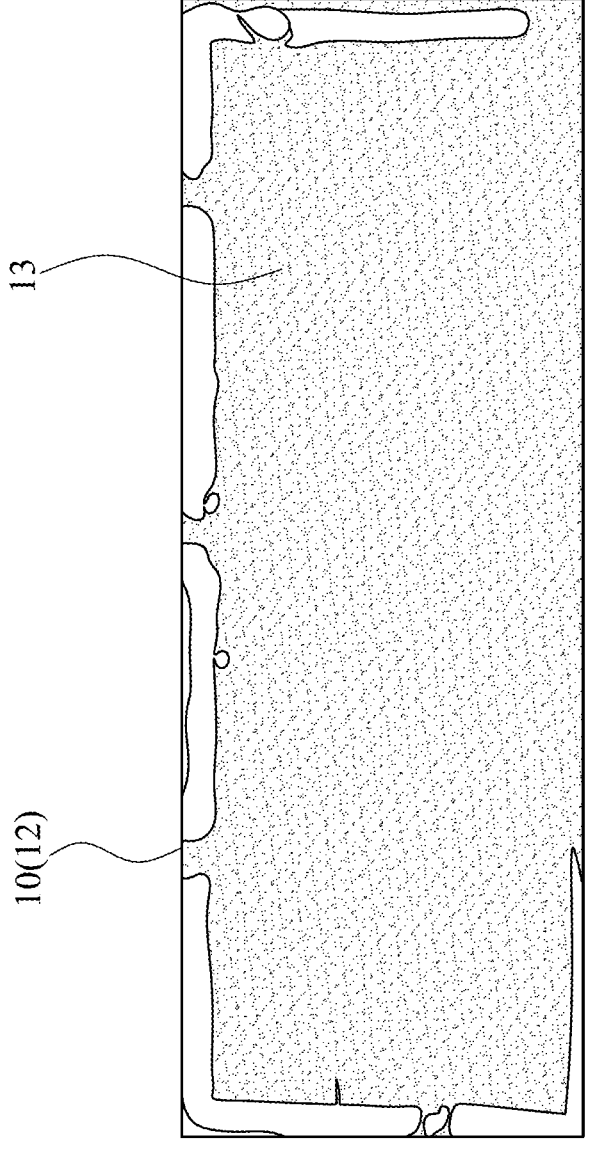
FIG. 2C illustrates a cross-sectional view of a part of an example of an electronic package according to some arrangements of the present disclosure.

FIGS. 2A, 2B, and 2C illustrate cross-sectional views of a part of an example of an electronic package according to some arrangements of the present disclosure. The cross-sectional views may be a part of the electronic packages of the present disclosure.

FIG. 2A illustrates the humidity indicator 13 in a test paper form. The humidity indicator 13 may be embedded, covered, or surrounded by the carrier 10 and/or the encapsulant 12. The boundary between the humidity indicator 13 and the carrier 10 (and/or the boundary between the humidity indicator 13 and the encapsulant 12) can be observed from FIG. 2A.

FIG. 2B illustrates the humidity indicator 13 in a powder form. The shade of the color in FIG. 2B represents the concentration of the humidity indicator 13.

The particles of the humidity indicator 13 of FIG. 2B are distributed or blended in the carrier 10 and/or the encapsulant 12 in a non-uniform way. The concentration of the humidity indicator 13 in the carrier 10 and/or the encapsulant 12 is uneven.

Therefore, if atmospheric elements (such as moisture, oxygen, or other chemical compounds or chemical elements) are present inside the electronic package, a chemical property (such as a color) of the humidity indicator 13 may be uneven. Consequently, the shade of the color in FIG. 2B may be uneven.

FIG. 2C also illustrates the humidity indicator 13 in a powder form. However, the particles of the humidity indicator 13 are distributed or blended in the carrier 10 and/or the encapsulant 12 in a uniform way. The concentration of the humidity indicator 13 in the carrier 10 and/or the encapsulant 12 is substantially even.

Therefore, if atmospheric elements (such as moisture, oxygen, or other chemical compounds or chemical elements) are present inside the electronic package, a chemical property (such as a color) of the humidity indicator 13 may be substantially even.

In some arrangements where the particles of the humidity indicator 13 are distributed in the encapsulant 12, the color of the encapsulant 12 may vary as a function of the variation of moisture/humidity level/value inside the electronic package 1.

Figure 2D:
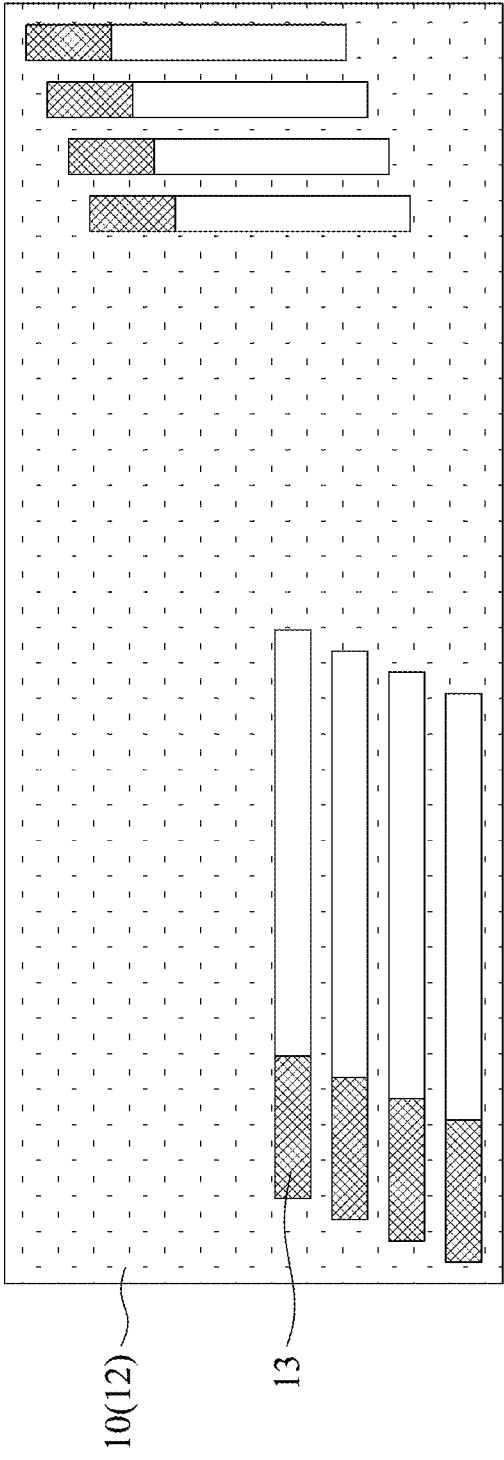
FIG. 2D illustrates a top view of a part of an example of an electronic package according to some arrangements of the present disclosure.

FIG. 2D illustrates a top view of a part of an example of an electronic package according to some arrangements of the present disclosure. The top view may be a part of the electronic packages of the present disclosure.

FIG. 2D illustrates the humidity indicator 13 in a test paper form. The humidity indicator 13 may be embedded, covered, or surrounded by the carrier 10 and/or the encapsulant 12. The humidity indicator 13 may be disposed closer to a periphery or an edge of the carrier 10 and/or the encapsulant 12. The humidity indicator 13 may extend along or adjacent to a periphery or an edge of the carrier 10 and/or the encapsulant 12. The other parts of the electronic package are not shown for clarity.

In some arrangements, there may be a plurality of humidity indicators 13 extending along a periphery or an edge of the carrier 10 and/or the encapsulant 12. In some arrangements, one set of the humidity indicators 13 may extend along a first direction and another set of the humidity indicators 13 may extend along a second direction. For example, one set of the humidity indicators 13 may be disposed along an edge of the carrier 10 and/or the encapsulant 12 and another set of the humidity indicators 13 may be disposed along another edge of the carrier 10 and/or the encapsulant 12.

FIG. 3 illustrates a cross-sectional view of an example of an electronic package 3 according to some arrangements of the present disclosure.

In some arrangements, the electronic package 3 may include a carrier 30, an electronic component 31, an encapsulant 32, and one or more humidity indicators 33a, 33b, and 33c.

The carrier 30 may be a carrier such as the carrier 10 of the electronic package 1 in FIG. 1A. In some arrangements, the carrier 30 may include a lead frame on an exterior of the carrier 30. The carrier 30 may include a die paddle for supporting the electronic component 31.

The electronic component 31 may be an electronic component such as the electronic component 11 of the electronic package 1 in FIG. 1A. In some arrangements, the electronic component 31 may be electrically connected to a lead of the carrier 30 by a conductive wire 31w. In some arrangements, the electronic component 31 may be an optoelectronic device used to detect or emit visible light and/or other forms of electromagnetic radiation.

The encapsulant 32 may be an encapsulant such as the encapsulant 12 of the electronic package 1 in FIG. 1A. In some arrangements, the encapsulant 32 may have a protruding portion or a convex shape over the electronic component 31. In some arrangements, the protruding portion of the encapsulant 32 may serve as an optical element for manipulating (e.g., condensing) an electromagnetic radiation emitted toward or from the electronic component 31.

The humidity indicators 33a, 33b, and 33c may each be a humidity indicator such as the humidity indicator 13 of the electronic package 1 in FIG. 1A.

The humidity indicator 33a may be disposed on and in direct contact with the encapsulant 32. The humidity indicator 33a may be disposed on an outer surface of the encapsulant 32. The humidity indicator 33a may be disposed on the protruding portion of the encapsulant 32. The humidity indicator 33a may be exposed from the encapsulant 32. The humidity indicator 33a may be disposed over the electronic component 31. For example, the humidity indicator 33a and the electronic component 31 may be vertically aligned along an axis perpendicular to or traversing a surface 301 of the carrier 30 or a surface 311.

In some arrangements, the humidity indicator 33a may be at least partially embedded in the encapsulant 32 for example, in a tip portion or another portion of the protruding portion or a convex shape, or in another suitable portion of the encapsulant 32. In some arrangements where the particles of the humidity indicator 33a are distributed in the encapsulant 32 (as shown in FIG. 2B or FIG. 2C), the color of the encapsulant 32 may vary as a function of the moisture/humidity level/value in the electronic package 3. Therefore, the humidity indicator 33a and the encapsulant 32 may function as a color filter for the electronic component 31. For example, if the color of the encapsulant 32 changes due to the presence of the humidity indicator 33a, a wavelength range of the electromagnetic radiation emitted toward or from the electronic component 31 may be filtered out by the encapsulant 32.

The humidity indicator 33b may be disposed on and directly contact a lead of the carrier 30. The humidity indicator 33b may be disposed on a surface 301 of the carrier 30. The humidity indicator 33b may be covered or enclosed by the encapsulant 32. The humidity indicator 33b may be disposed on an interface between the carrier 30 and the encapsulant 32.

The humidity indicator 33c may be disposed on an active surface (e.g., the surface 311) of the electronic component 31. In some arrangements, the humidity indicator 33c may function as a color filter for the electronic component 31. As disclosed, the color of the humidity indicator 33c may change as a function of the moisture/humidity level/value in its surround, thus acting as a color filter for the electronic component 31.

The humidity indicators 33a, 33b, and 33c are illustrated to represent the locations where it is possible to dispose humidity indicators. The locations and numbers of the humidity sensors in the electronic package 3 may be adjusted according to design requirements and are not limited to the specific examples shown in the figures.

Figure 4A:
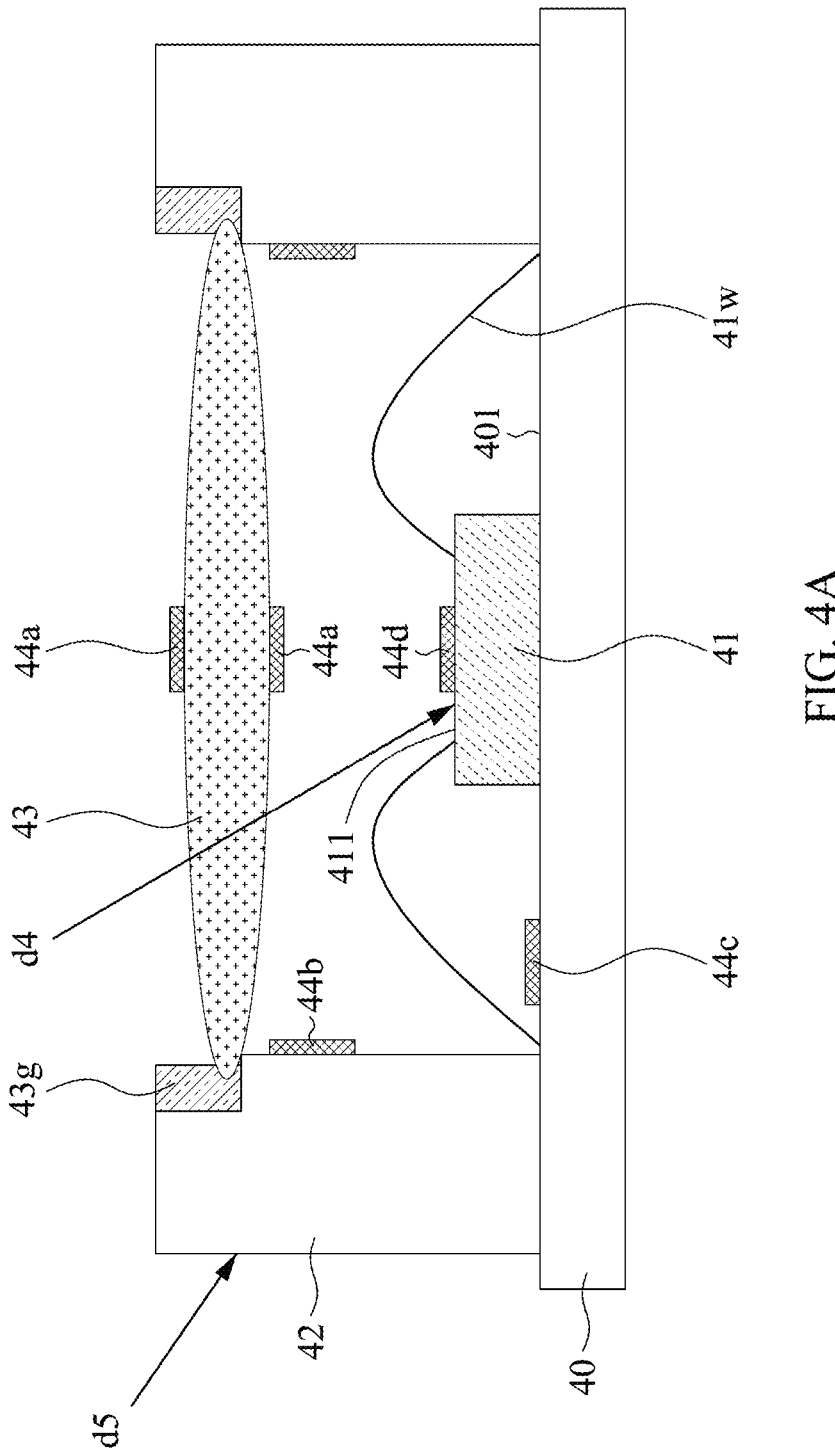
FIG. 4A illustrates a cross-sectional view of an example of an electronic package according to some arrangements of the present disclosure.

FIG. 4A illustrates a cross-sectional view of an example of an electronic package 4 according to some arrangements of the present disclosure.

In some arrangements, the electronic package 4 may include a carrier 40, an electronic component 41, a wall structure 42, an optical element 43, and one or more humidity indicators 44a, 44b, 44c, and 44d.

The carrier 40 may be a carrier such as the carrier 10 of the electronic package 1 in FIG. 1A.

The electronic component 41 may be an electronic component such as the electronic component 11 of the electronic package 1 in FIG. 1A. In some arrangements, the electronic component 41 may be electrically connected to the carrier 40 by a conductive wire 41*w*. In some arrangements, the electronic component 41 may be an optoelectronic device used to detect or emit visible light and/or other forms of electromagnetic radiation.

The wall structure 42 may be disposed on the carrier 40. The wall structure 42 may surround a periphery of the carrier 40 and may define an opening or an aperture in which the electronic component 41 is disposed.

The wall structure 42 may include an opaque material. The opaque material may be an opaque epoxy (e.g., a black epoxy) or other opaque resin or polymer that does not allow electromagnetic radiation radiated by the electronic component 41 to pass through. In some embodiments, the wall structure 42 may not allow external electromagnetic radiation to pass through and to be detected by the electronic component 41.

The optical element 43 may be disposed within the opening of the wall structure 42. The optical element 43 may be supported by the wall structure 42. The optical element 43 may be attached to the wall structure 42 by an adhesive layer 43*g*. The adhesive layer 43*g* may include epoxy, resin, or other suitable materials, and may be a paste.

The optical element 43 may be disposed over the electronic component 41. For example, the optical element 43 and the electronic component 41 may be vertically aligned along an axis perpendicular to or traversing a surface 411 of the electronic component 41. The optical element 43 may be configured to allow transmission of electromagnetic radiation emitted toward or from the electronic component 41. In some arrangements, the optical element 43 may be a lens.

The humidity indicators 44*a*, 44*b*, 44*c*, and 44*d* may each be a humidity indicator such as the humidity indicator 13 of the electronic package 1 in FIG. 1A. The humidity indicators 44*a*, 44*b*, 44*c*, and 44*d* may each be exposed to air or a vacuum environment in the internal space of the electronic package 4 defined by the wall structure 42, the carrier 40, and the optical element 43.

The humidity indicator 44*a* may be disposed on or directly contacting the optical element 43. The humidity indicator 44*a* may be disposed on a surface of the optical element 43 facing the electronic component 41. Therefore, the humidity indicator 44*a* may be disposed in the internal space of the electronic package 4.

In some arrangements, another humidity indicator 44*a* may be disposed on a surface of the optical element 43 facing away from the electronic component 41. Therefore, the another humidity indicator 44*a* may be disposed outside of the electronic package 4. The another humidity indicator 44*a* may be exposed to the external environment of the electronic package 4.

The humidity indicator 44*b* may be disposed on or directly contacting the wall structure 42. The humidity indicator 44*b* may be disposed on an internal lateral surface of the electronic package 4. The humidity indicator 44*b* may be disposed adjacent to an interface between any two of the wall structure 42, the adhesive layer 43*g*, and the optical element 43.

The humidity indicator 44*c* may be disposed on or directly contacting a surface 401 of the carrier 40. The humidity indicator 44*b* may be disposed adjacent to an interface between the carrier 40 and the wall structure 42.

The humidity indicator 44*d* may be disposed on or directly contacting an active surface (e.g., the surface 411) of the electronic component 41.

The humidity indicators 44*a*, 44*b*, 44*c*, and 44*d* are illustrated to represent the locations on which it is possible to dispose humidity indicators. The locations and numbers of the humidity sensors in the electronic package 4 may be adjusted according to design requirements and are not limited to the specific examples shown in the figures.

At least a part of each of the humidity indicators 44*a*, 44*b*, 44*c*, and 44*d* may not be hidden from view by the wall structure 42 when viewed by an operator in a direction d4 that traverses the optical element 43. However, the humidity indicators 44*a*, 44*b*, 44*c*, and 44*d* may be blocked when viewed by an operator in a direction d5.

Figure 4B:
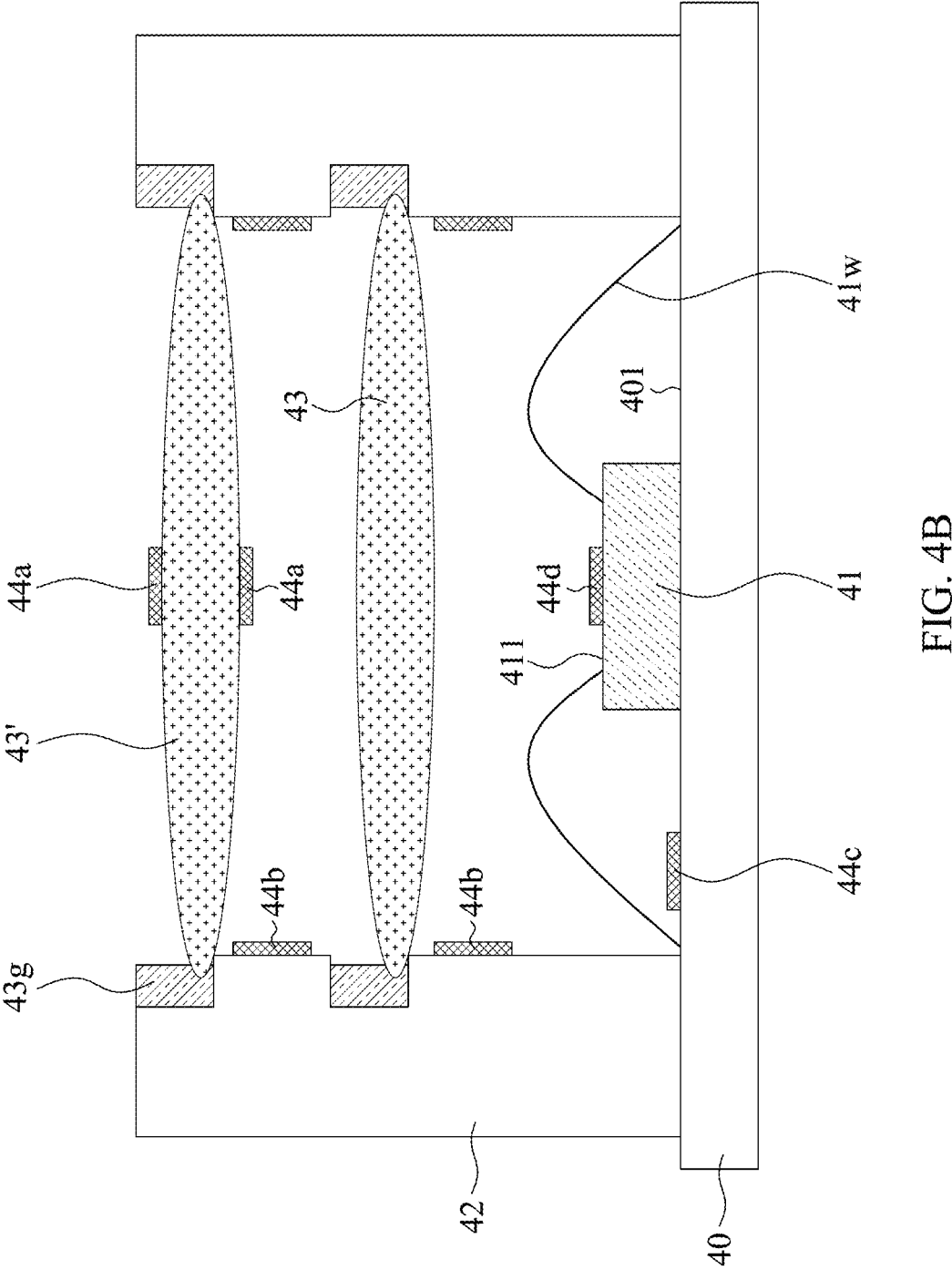
FIG. 4B illustrates a cross-sectional view of an example of an electronic package according to some arrangements of the present disclosure.

FIG. 4B illustrates a cross-sectional view of an example of an electronic package 4' according to some arrangements of the present disclosure. The electronic package 4' in FIG. 4B is similar to the electronic package 4 in FIG. 4A. Therefore, some detailed descriptions may refer to the corresponding paragraphs above and are not repeated hereinafter for conciseness.

The electronic package 4' further includes an optical element 43' over the optical element 43. The optical element 43' may be disposed within the opening of the wall structure 42. The optical element 43' may be supported by the wall structure 42. The optical element 43' may be attached to the wall structure 42 by an adhesive layer 43*g*. The humidity indicator 44*b* may be disposed between the optical element 43' and the optical element 43.

Figure 5:
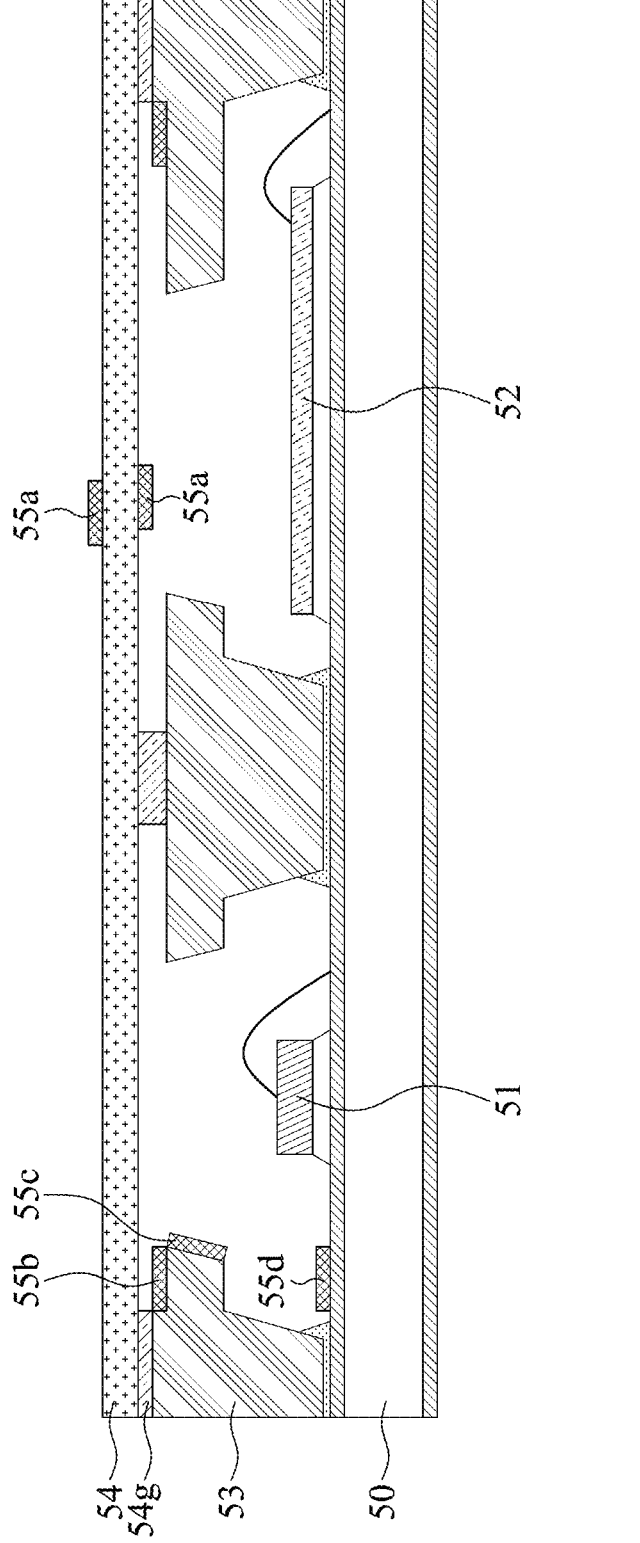
FIG. 5 illustrates a cross-sectional view of an example of an electronic package according to some arrangements of the present disclosure.

FIG. 5 illustrates a cross-sectional view of an example of an electronic package 5 according to some arrangements of the present disclosure.

In some arrangements, the electronic package 5 may include a carrier 50, electronic components 51, 52, a wall structure 53, an optical element 54, and one or more humidity indicators 55*a*, 55*b*, 55*c*, and 55*d*.

The carrier 50 may be a carrier such as the carrier 10 of the electronic package 1 in FIG. 1A.

The electronic components 51 and 52 may each be an electronic component such as the electronic component 11 of the electronic package 1 in FIG. 1A. In some arrangements, the electronic components 51 and 52 may each be electrically connected to the carrier 50 by a conductive wire. In some arrangements, the electronic components 51 and 52 may each be an optoelectronic device used to detect or emit visible light and/or other forms of electromagnetic radiation. For example, the electronic component 51 may be an optical emitter and the electronic component 52 may be an optical detector, or vice versa.

The wall structure 53 may be a wall structure such as the wall structure 42 of the electronic package 4 in FIG. 4A. The wall structure 53 may be disposed on the carrier 50. The wall structure 53 may define an opening or an aperture in which the electronic component 51 is disposed. The wall structure 53 may define an opening or an aperture in which the electronic component 52 is disposed. A part of the wall structure 53 may be disposed between the electronic components 51 and 52.

The optical element 54 may correspond to the optical element 43 of the electronic package 4 in FIG. 4A. The optical element 54 may be attached to the wall structure 53 by an adhesive layer 54*g*. The adhesive layer 54*g* may include epoxy, resin, or other suitable materials, and may be a paste.

The humidity indicators 55*a*, 55*b*, 55*c*, and 55*d* may be similar to the humidity indicators described above. The humidity indicators 55*a*, 55*b*, 55*c*, and 55*d* may each be exposed to air or a vacuum environment in the internal space of the electronic package 5. For example, the humidity indicator 55*a* is disposed on or directly contacting an upper the optical element 54 facing away from the carrier 50, the optical element 55*a* is exposed to air external to the internal space of the electronic package 5. Another humidity indicator 55*a* is disposed on or directly contacting a lower surface of the optical element 54 facing the carrier 50 and is exposed to the internal space of the electronic package 5.

The humidity indicator 55*b* may be disposed on or directly contacting a surface of the wall structure 53 and face the optical element 54. The humidity indicator 55*b* may be disposed adjacent to an interface between any two of the wall structure 53, the adhesive layer 54*g*, and the optical element 54. The humidity indicator 55*c* may be disposed on or directly contacting a surface of the wall structure 53 and face another portion of the wall structure 53 or the center of the internal space of the electronic package 5. The humidity indicator 55*c* may be disposed adjacent to the humidity indicator 55*b* and an interface between any two of the wall structure 53, the adhesive layer 54*g*, and the optical element 54. The humidity indicator 55*d* may be disposed on the carrier 50. The humidity indicator 55*d* may be disposed adjacent to an interface between the carrier 50 and the wall structure 53.

Some detailed descriptions of the humidity indicators 55*a*, 55*b*, 55*c*, and 55*d* are described in the corresponding paragraphs above, which are not repeated hereinafter for conciseness.

Figure 6:
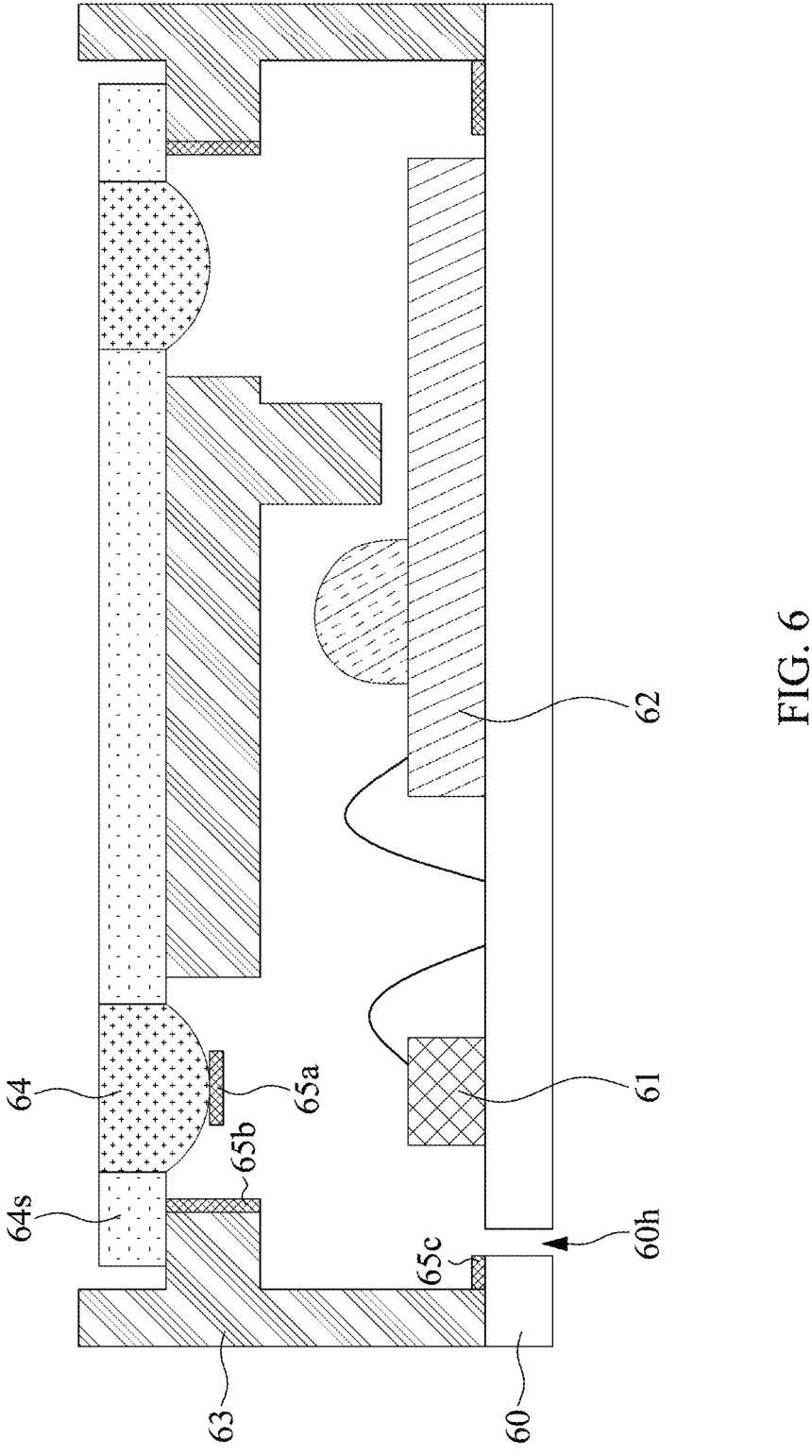
FIG. 6 illustrates a cross-sectional view of an example of an electronic package according to some arrangements of the present disclosure.

FIG. 6 illustrates a cross-sectional view of an example of an electronic package 6 according to some arrangements of the present disclosure.

In some arrangements, the electronic package 6 may include a carrier 60, electronic components 61, 62, a wall structure 63, an optical element 64, and one or more humidity indicators 65*a*, 65*b*, and 65*c*.

The carrier 60 may correspond to the carrier 10 of the electronic package 1 in FIG. 1A. The carrier 60 may define a vent hole 60*h*. The vent hole 60*h* may allow air to pass through and enter into the internal space of the electronic package 6.

The electronic components 61 and 62 may each correspond to the electronic component 11 of the electronic package 1 in FIG. 1A. In some arrangements, the electronic components 61 and 62 may each be electrically connected to the carrier 60 by a conductive wire. In some arrangements, the electronic components 61 and 62 may each be an optoelectronic device used to detect or emit visible light and/or other forms of electromagnetic radiation. For example, the electronic component 61 may be an optical emitter and the electronic component 62 may be an optical detector, or vice versa.

The wall structure 63 may correspond to the wall structure 42 of the electronic package 4 in FIG. 4A. The wall structure 63 may be disposed on the carrier 60. The wall structure 63 may define an opening or an aperture in which the electronic component 61 is disposed. The wall structure 63 may define an opening or an aperture in which the electronic component 62 is disposed. The wall structure 63 may not be disposed between the electronic components 61 and 62.

The optical element 64 may correspond to the optical element 43 of the electronic package 4 in FIG. 4A. The optical element 64 may be disposed on the wall structure 64 by a supporting element 64*s*. The supporting element 64*s* may be disposed on the wall structure 63.

The humidity indicators 65*a*, 65*b*, and 65*c* may be similar to the humidity indicators described above. The humidity indicators 65*a*, 65*b*, and 65*c* may each be exposed to air or a vacuum environment in the internal space of the electronic package 6. For example, humidity indicator 65*a* is disposed on or directly contacting a lower surface of the optical element 64 facing the carrier 60 and is exposed to the internal space of the electronic package 5.

The humidity indicator 65*b* may be disposed on or directly contacting a surface of the wall structure 63 and face the optical element 54, another portion of the wall structure 63, or the internal space of the electronic package 5. The humidity indicator 65*b* may be disposed adjacent to an interface between any two of the wall structure 53, the supporting element 64*s*, and the optical element 64. The humidity indicator 65*c* may be disposed on and directly contacting the carrier 60. The humidity indicator 65*c* may be disposed adjacent to an interface between the carrier 60, the vent hole 60*h*, and the wall structure 63.

Some detailed descriptions of the humidity indicators 65*a*, 65*b*, and 65*c* are described in the corresponding paragraphs above, which are not repeated hereinafter for conciseness.

Figure 7:
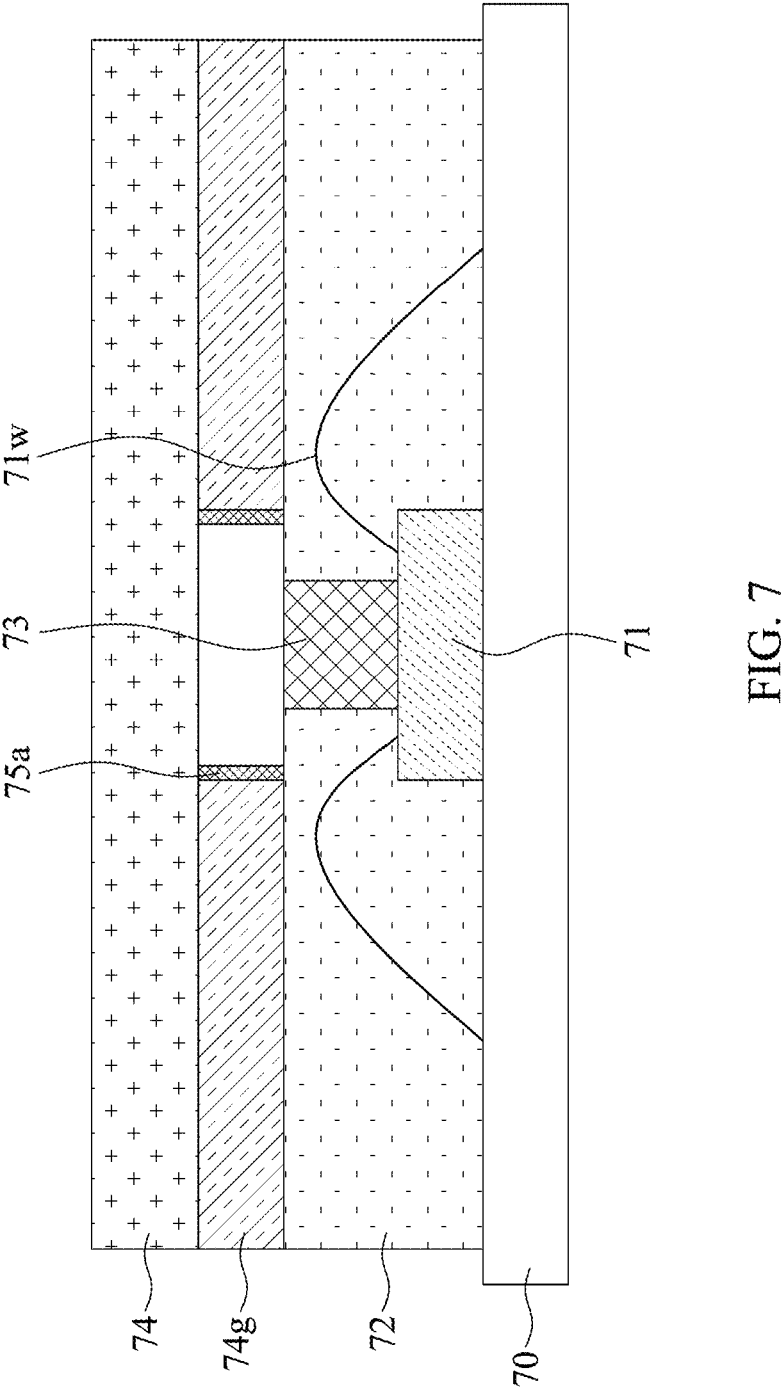
FIG. 7 illustrates a cross-sectional view of an example of an electronic package according to some arrangements of the present disclosure.

FIG. 7 illustrates a cross-sectional view of an example of an electronic package 7 according to some arrangements of the present disclosure. The electronic package 7 in FIG. 7 is similar to the electronic package 1 in FIG. 1A and the electronic package 4 in FIG. 4A.

In some arrangements, the electronic package 7 may include a carrier 70, an electronic component 71, an encapsulant 72, an optical element 73, an optical filter 74, and a humidity indicator 75*a*.

The carrier 70 may be a carrier such as the carrier 10 of the electronic package 1 in FIG. 1A.

The electronic component 71 may correspond to the electronic component 11 of the electronic package 1 in FIG. 1A. In some arrangements, the electronic component 71 may be electrically connected to the carrier 70 by a conductive wire 71*w*. In some arrangements, the electronic component 71 may be an optoelectronic device used to detect or emit visible light and/or other forms of electromagnetic radiation.

The encapsulant 72 may be an encapsulant such as the encapsulant 12 of the electronic package 1 in FIG. 1A.

The optical element 73 may be an optical element such as the optical element 43 of the electronic package 4 in FIG. 4A.

The optical filter 74 may be disposed over the electronic component 71.

The optical filter 74 may be attached to the encapsulant 72 by an adhesive layer 74*g*. The adhesive layer 74*g* may include epoxy, resin, or other suitable materials, and may be a paste. The optical filter 74 may be configured to allow electromagnetic radiation with predetermined wavelengths to pass through.

The humidity indicator 75*a* may be similar to the humidity indicators described above. The humidity indicator 75*a* may be attached to the adhesive layer 74*g*, and is located at an interface among the optical filter 74, the adhesive layer 74*g*, the carrier 72, and the optical element 73. The humidity indicator 75*a* may be exposed to air or a vacuum environment in the internal space of the electronic package 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic package, comprising:
a carrier;
an optical component disposed on the carrier;
a first humidity indicator directly contacting a central portion of an active surface of the optical component;
a first lens disposed over the optical component;
a second lens disposed over the first lens, wherein the second lens includes a first convex surface facing the first lens and a second convex surface facing away from the first lens;
a second humidity indicator disposed on a vertex of the first convex surface of the second lens; and
a third humidity indicator disposed on a vertex of the second convex surface of the second lens,
wherein a position of the first humidity indicator within the electronic package is arranged such that at least a part of the first humidity indicator is visible from a viewpoint outside of the electronic package.

2. The electronic package of claim 1, further comprising:
a conductive wire having a first end connected to a periphery of the active surface of the optical component and a second end connected to the carrier, the first end being at a higher elevation than the second end.

3. The electronic package of claim 1, wherein the first humidity indicator protrudes from the optical component and toward a convex surface of the first lens, and no other optical element is present between the first humidity indicator and the convex surface of the first lens.

4. The electronic package of claim 1, wherein a color of an electromagnetic radiation radiated by the optical component is changed by the first humidity indicator.

5. The electronic package of claim 1, wherein the first humidity indicator, the second humidity indicator, and the third humidity indicator have substantially a same shape.

6. The electronic package of claim 1, wherein the first humidity indicator, the second humidity indicator, and the third humidity indicator are vertically aligned along an axis perpendicular to the active surface of the optical component.

7. The electronic package of claim 1, wherein the second humidity indicator protrudes from the second lens and toward a convex surface of the first lens.

8. The electronic package of claim 1, wherein the first convex surface and the second convex surface of the second lens are continuously connected, and the first lens and the second lens have substantially a same shape.

9. The electronic package of claim 8, wherein the first convex surface and the second convex surface of the second lens are jointed to form a curved surface, and the first lens and the second lens have substantially a same width in a cross-sectional view.

10. The electronic package of claim 9, further comprising:
a wall structure disposed over the carrier, wherein the curved surface of the second lens extends into a recess portion of the wall structure.

11. The electronic package of claim 10, further comprising:
a fourth humidity indicator disposed on an internal surface of the wall structure and between the first lens and the second lens.

12. The electronic package of claim 10, further compris-
ing:
   an adhesive layer disposed in the recess portion of the
      wall structure and surrounding the curved surface of the
      second lens.

13. The electronic package of claim 12, wherein the
adhesive layer has four sides in a cross-sectional view.

14. The electronic package of claim 1, further comprising:
   a wall structure disposed over the carrier, wherein the
      second lens, the wall structure, and the carrier define an
      internal space, and the first lens divides the internal
      space into a first region and a second region; and
   a fourth humidity indicator disposed on the wall structure,
      wherein a curved surface of the first lens extends into a
      recess portion of the wall structure.

15. The electronic package of claim 1, wherein the third
humidity indicator and the first humidity indicator are ver-
tically aligned along an axis perpendicular to the active
surface of the optical component.

16. The electronic package of claim 14, wherein the
optical component is disposed in the first region, and a
height of the first region is greater than a height of the second
region in a cross-sectional view, and no other optical ele-
ment is present between the optical component and a convex
surface of the first lens.

* * * * *